United States Patent
Li et al.

(10) Patent No.: US 10,241,537 B2
(45) Date of Patent: Mar. 26, 2019

(54) DIGITAL ON-CHIP DUTY CYCLE MONITORING DEVICE

(71) Applicant: Apple Inc., Cupertino, CA (US)

(72) Inventors: Huaimin Li, San Jose, CA (US);
Fabien S Faure, Santa Clara, CA (US);
Shy Hamami, Ganei-Tikva (IL);
Pradeep Trivedi, Saratoga, CA (US);
Yaron Cohen, Kfar-Saba (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/622,350

(22) Filed: Jun. 14, 2017

(65) Prior Publication Data

US 2018/0364752 A1     Dec. 20, 2018

(51) Int. Cl.
| | |
|---|---|
| *H03K 3/017* | (2006.01) |
| *H03K 5/156* | (2006.01) |
| *G01D 5/24* | (2006.01) |
| *G06F 1/08* | (2006.01) |
| *H03K 21/08* | (2006.01) |
| *H03K 5/04* | (2006.01) |
| *H03K 5/00* | (2006.01) |

(52) U.S. Cl.
CPC .............. *G06F 1/08* (2013.01); *H03K 3/017* (2013.01); *H03K 5/04* (2013.01); *H03K 21/08* (2013.01); *H03K 2005/00019* (2013.01)

(58) Field of Classification Search
CPC . G06F 1/08; H03K 3/017; H03K 5/04; H03K 21/08; H03K 2005/00019
USPC .............. 327/2–12, 105–123, 141, 144–163; 331/1 A, 15–17; 375/373–376
See application file for complete search history.

(56) References Cited

U.S. PATENT DOCUMENTS

| 6,737,927 | B2 * | 5/2004 | Hsieh | ................... | H03K 5/1565 |
| | | | | | 327/107 |
| 7,298,193 | B2 | 11/2007 | Agarwal | | |
| 7,612,622 | B2 | 11/2009 | Margittai | | |
| 9,236,853 | B2 | 1/2016 | Walker | | |
| 9,515,604 | B2 * | 12/2016 | Griffith | ..................... | H03B 5/06 |
| 9,564,885 | B2 | 2/2017 | Chau | | |
| 2012/0326760 | A1 * | 12/2012 | Kesselring | ............. | H03K 3/017 |
| | | | | | 327/175 |
| 2014/0009197 | A1 * | 1/2014 | Yasuda | ................... | H03K 3/017 |
| | | | | | 327/175 |
| 2015/0222254 | A1 * | 8/2015 | Walker | ...................... | H03K 5/05 |
| | | | | | 327/175 |
| 2016/0323954 | A1 * | 11/2016 | Nozawa | ............... | H05B 33/086 |

(Continued)

*Primary Examiner* — Brandon S Cole
(74) *Attorney, Agent, or Firm* — Meyertons, Hood, Kivlin, Kowert & Goetzel, P.C.

(57) ABSTRACT

An apparatus includes an oscillator circuit, a counter circuit, and a control circuit. The oscillator circuit may receive an input clock signal and an inverse input clock signal, and, for a first time period, may generate an oscillator output signal with a frequency based on a duty cycle of the input clock signal. For a second time period, the oscillator circuit may generate the oscillator output signal with a frequency based on a duty cycle of the inverse input clock signal. The counter circuit may count oscillations of the oscillator output signal over the first time period and over the second time period. The control circuit may determine, based on the oscillations counted by the counter circuit during the first time period and the second time period, a duty cycle value indicative of the duty cycle of the input clock signal.

20 Claims, 9 Drawing Sheets

(56) References Cited

U.S. PATENT DOCUMENTS

2017/0366195 A1* 12/2017 Kim .................... H03K 3/0315
2018/0107238 A1*  4/2018 Yamamoto ................ G06F 1/04

* cited by examiner

DIGITAL ON-CHIP DUTY CYCLE MONITORING DEVICE

BACKGROUND

Technical Field

Embodiments described herein are related to the field of integrated circuits, and more particularly to the monitoring of clock signals within an integrated circuit.

Description of the Related Art

Systems-on-a-chip (SoCs) designs may include one or more clock signal generators, configured to generate a clock signal at a target frequency with a target duty cycle. A common target duty cycle for a clock signal is 50%, in which the signal remains in the high state for half of the clock period and in a low state for the other half of the period.

Some functional circuits used in SoC designs, may perform better when receiving a clock signal with a duty cycle in a particular range. For example, when exchanging data, some data interfaces may submit an address for a data location during a high phase of a clock cycle and send the data during a low phase of the clock cycle. In some embodiments, a 50% duty cycle may result in an optimal clock signal for exchanging the data. In other embodiments, a 40% duty cycle, in which the high phase lasts for 40% of a clock period, may provide extra time for processing the data, which might allow the interface to run at a higher frequency.

SUMMARY OF THE EMBODIMENTS

Various embodiments of a clock generation unit are disclosed. Broadly speaking, systems, apparatus, and methods are contemplated in which the apparatus includes an oscillator circuit, a counter circuit, and a control circuit. In some embodiments, the oscillator circuit may be configured to receive an input clock signal and an inverse input clock signal, and, for a first time period, generate an oscillator output signal with a frequency based on a duty cycle of the input clock signal. The oscillator circuit may be further configured to, for a second time period, generate the oscillator output signal with a frequency based on a duty cycle of the inverse input clock signal. The counter circuit may be configured to count oscillations of the oscillator output signal over the first time period and over the second time period. The control circuit may be configured to determine, based on the oscillations counted by the counter circuit during the first time period and the second time period, a duty cycle value indicative of the duty cycle of the input clock signal.

In a further embodiment, the apparatus may include a duty cycle adjustment circuit configured to compare the duty cycle value to an expected value. In one embodiment, the duty cycle adjustment circuit may be further configured to modify a duty cycle of the input clock signal based on the comparison. In another embodiment, the expected value may be programmable and, in addition, determined based on a duty cycle for the input clock signal.

In an embodiment, the counter circuit may be further configured to increment a count value during the first time period, and then to decrement the count value during the second time period. The second time period is subsequent to the first time period.

In another embodiment, a length of the first time period and a length of the second time period may be programmable. In a further embodiment, the control circuit may also be configured to receive a first value corresponding to the length of the first time period and a second value corresponding to the second time period. The first and second values may be selected based on a desired duty cycle for the input clock signal.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

A clock signal generator circuit may be used to generate a clock signal in an integrated circuit (IC). Some functional circuits that receive a clock signal may have improved performance or functionality when receiving a clock signal with a duty cycle in a particular range. For example, a 75% duty cycle may refer to a signal that is in a high state for 75% of a clock period, while a 20% duty cycle may refer to a signal that remains in a low state for 20% of the clock period.

A duty cycle monitoring circuit may be utilized to determine a duty cycle of the clock signal. In various embodiments, such monitoring circuits may operate continuously, periodically, or upon request. The clock signal generator circuit may, in some embodiments, be adjusted in response to detecting the duty cycle of the clock signal reaching a threshold value, thereby brining the duty cycle to a more desirable value.

In addition to adjusting a clock signal generator circuit, duty cycle monitoring circuits may also be used as part of test and/or evaluation procedures. Duty cycle monitoring circuits may facilitate testing of one or more clock generation circuits included in the IC. Delay circuits may also be tested using duty cycle monitoring circuits.

The various embodiments illustrated in the drawings and described below may provide a duty cycle monitoring circuit that meets a desired size constraint. These embodiments may employ techniques that also reduce power consumption while in an operational state.

Some terms commonly used in reference to IC designs are used in this disclosure. For the sake of clarity, the intended definitions of some of these terms, unless stated otherwise, are as follows.

A Metal-Oxide Semiconductor Field-Effect Transistor (MOSFET) describes a type of transconductive device that may be used in modern digital logic designs. MOSFETs are designed as one of two basic types, n-channel and p-channel. N-channel MOSFETs open a conductive path between the source and drain when a positive voltage greater than the device's threshold voltage is applied between the gate and the source. P-channel MOSFETs open a conductive path when a voltage greater than the device's threshold voltage is applied between the source and the gate.

Complementary MOSFET (CMOS) describes a circuit designed with a mix of n-channel and p-channel MOSFETs. In CMOS designs, n-channel and p-channel MOSFETs may be arranged such that a high voltage level (also referred to as a "high level," "logic high," or simply "high") on the gate of a MOSFET turns an n-channel device on, i.e., opens a conductive path, and turns a p-channel MOSFET off, i.e., closes a conductive path. Conversely, a low voltage level (also referred to as a "low level," "logic low," or simply "low") on the gate of a MOSFET turns a p-channel on and an n-channel off In various other embodiments, different technology may result in different voltage levels for "low" and "high."

As used herein, a "logic signal" refers to a signal that transitions between a high logic level and a low logic level. A "clock signal" refers to a logic signal with repetitive transitions between low and high levels. A "clock cycle" includes a high phase and a low phase. The "high phase" corresponds to a time when the voltage level of the clock signal is at a high logic level, and the "low phase" to a time when the voltage level is at a low logic level. A clock cycle may start with a high phase or low phase and includes a series of clock cycles.

CMOS logic is used in the examples presented herein. It is noted, however, that any suitable digital logic process may be used for the circuits described in this disclosure.

Figure 1:
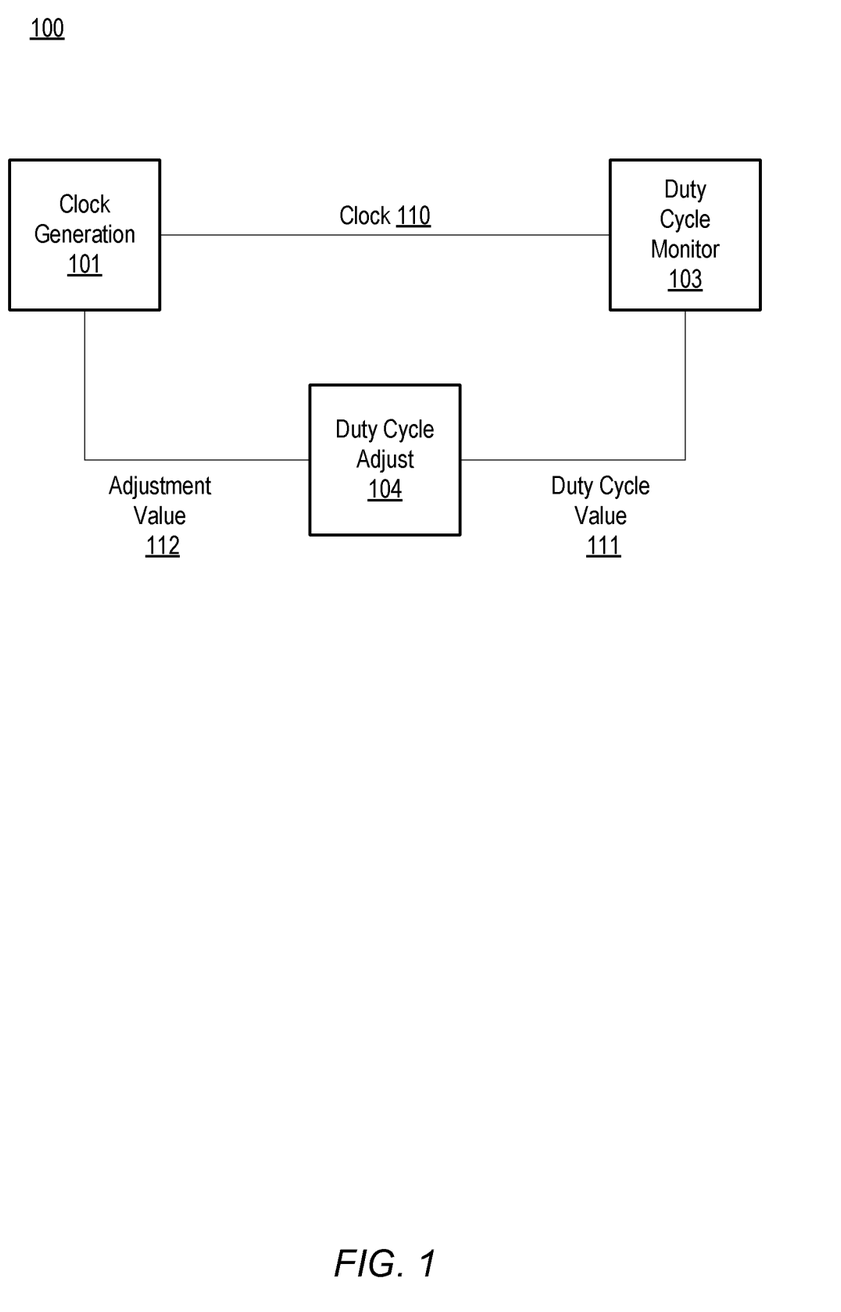
FIG. 1 depicts a block diagram of an embodiment of a clock generation system.

A block diagram of an embodiment of a clock generation system is illustrated in FIG. 1. System 100 may be included in an IC that includes circuits that may have improved performance when the clock signal is generated within a particular range of duty cycles. In such embodiments, system 100 may be used to generate a clock signal with a duty cycle within the particular range. System 100 includes Clock Generation Circuit 101 coupled to Duty Cycle Monitor Circuit 103, which is coupled, in turn, to Duty Cycle Adjustment Circuit 104.

Clock Generation Circuit 101 generates Clock Signal 110. In various embodiments, Clock Generation Circuit 101 may correspond to any suitable type of clock generating circuit, such as, for example, a crystal oscillator circuit, a phased-locked loop (PLL), a delay-locked loop (DLL), a frequency-locked loop (FLL), and the like. Clock Generation Circuit, in the illustrated embodiment, includes circuits for adjusting a duty cycle of Clock Signal 110 based on input received from Duty Cycle Adjustment Circuit 104.

Duty Cycle Monitor Circuit 103, in the illustrated embodiment, receives Clock Signal 110 and determines Duty Cycle Value 111 based on Clock Signal 110. Circuits included in Duty Cycle Monitor Circuit 103 determine count values corresponding to each of a high phase and a low phase of Clock Signal 110. Based on these count values, Duty Cycle Value 111 is determined. In various embodiments, Duty Cycle Monitor Circuit 103 may continuously or periodically monitor Clock Signal 110. In some embodiments, Duty Cycle Monitor Circuit 103 may monitor Clock Signal 110 in response to an assertion of a received trigger signal. Additional details of the operation of duty cycle monitor circuits will be disclosed below.

Duty Cycle Adjustment Circuit 104 receives Duty Cycle Value 111 from Duty Cycle Monitor Circuit 103. Based on the Duty Cycle Value 111, Duty Cycle Adjustment Circuit 104 determines Adjustment Value 112 and sends this value to the circuits in Clock Generation Circuit 101 that adjust the duty cycle of Clock Signal 110. In various embodiments, Duty Cycle Adjustment Circuit 104 may use different algorithms for determining Adjustment Value 112 based on Duty Cycle Value 111. For example, Duty Cycle Adjustment Circuit 104 may utilize a binary search algorithm to determine Adjustment Value 112. In such an embodiment, Duty Cycle Adjustment Circuit 104 may compare Duty Cycle Value 111 to an expected value and, based on if Duty Cycle Value 111 is higher or lower than the expected value, select a value for Adjustment Value 112 that is between a current value of Adjustment Value 112 and a corresponding limit. The new Adjustment Value 112 is sent to Clock Generation Circuit 101 and the process repeats until Duty Cycle Value 111 is within a particular range of the expected value.

In another example, Duty Cycle Adjustment Circuit 104 may utilize a linear search algorithm to determine Adjustment Value 112. In such embodiments, Duty Cycle Adjustment Circuit 104 may again compare Duty Cycle Value 111 to an expected value, and then increment or decrement a current value of Adjustment Value 112 based on this comparison, using a predetermined increment or decrement, respectively. Again, the new Adjustment Value 112 is sent to Clock Generation Circuit 101 and the process repeats until Duty Cycle Value 111 is within a particular range of the expected value.

Using either algorithm, the expected value may be programmable in some embodiments. A particular expected value may correspond to a particular duty cycle for Clock Signal 110. By making the expected value programmable, the duty cycle of Clock Signal 110 may be adjustable to suit a particular circuit that is currently active. In other embodiments, if more than one clock signal is monitored by System 100, then a programmable expected value allows a processor, or software running on the processor, to select a particular duty cycle for each clock signal that is monitored.

It is noted that System 100 illustrated in FIG. 1 is an example for presenting the disclosed concepts. Various additional circuit blocks may be included in other embodiments. Circuit blocks may be configured differently in some embodiments.

Figure 2:
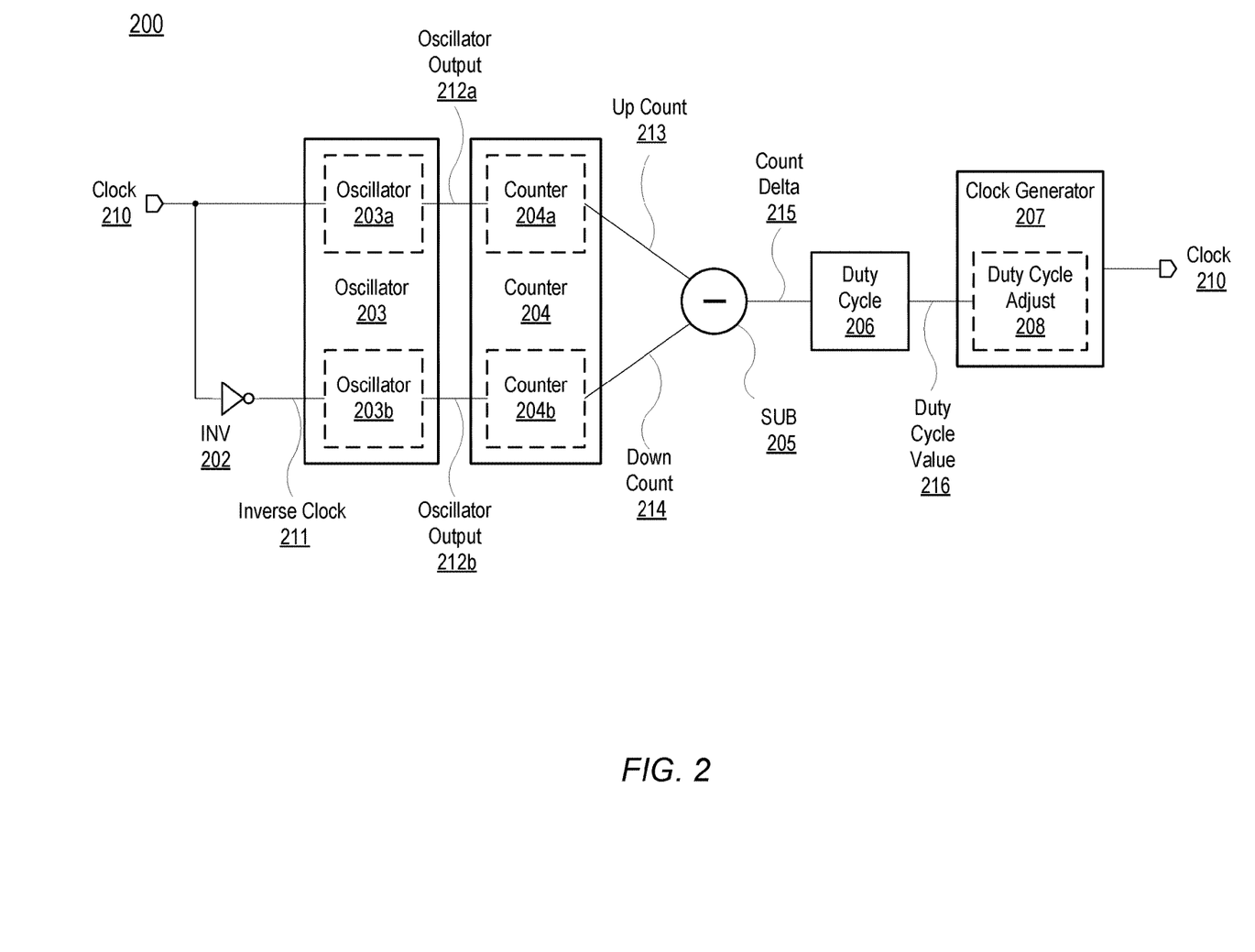
FIG. 2 illustrates a block diagram of an embodiment of a duty cycle monitoring circuit.

Moving to FIG. 2, a block diagram of an embodiment of a duty cycle monitoring circuit is illustrated. Monitoring Circuit 200 may be included in an IC that includes a clock generation circuit. In the illustrated embodiment, Monitoring Circuit 200 sends Clock Signal 210 to Oscillator Circuit 203 that is coupled to Counter Circuit 204, which, in turn, is coupled to subtraction circuit (SUB) 205. Clock Signal 210 is also sent to inverting circuit (INV) 202. INV 202 is also coupled to Oscillator Circuit 203. An output of SUB 205 is coupled to Duty Cycle Register 206. Duty Cycle Register 206 is coupled to Clock Generator Circuit 207, which includes Duty Cycle Adjustment Circuit 208. Clock Generator Circuit 207 generates Clock Signal 210 that is sent back to Oscillator Circuit 203 and INV 202.

In the illustrated embodiment, Monitoring Circuit 200 may be used to observe a duty cycle of Clock Signal 210. Clock Signal 210 may correspond to any suitable clock signal in the IC, and may, in some embodiments, correspond to different clock signals at different times dependent on current settings in the IC. Clock Signal 210 is sent to Oscillator Circuit 203 and to INV 202. INV 202 inverts Clock Signal 210, generating Inverse Clock Signal 211, which is also sent to Oscillator Circuit 203. Oscillator Circuit 203 includes Oscillators 203a and 203b that generate Oscillator Outputs 212a and 212b, respectively. A frequency of Oscillator Outputs 212a and 212b (collectively Oscillator Outputs 212) are based on a duty cycle of the respective input clock signal. A higher duty cycle on the input clock signal results in a higher frequency on the respective Oscillator Output 212.

Each of Oscillators 203a and 203b may correspond to any suitable type of oscillator circuit design, such as, for example, a ring oscillator. The input clock signal to each of Oscillators 203a and 203b may adjust the frequency of Oscillator Outputs 212 by any suitable method. For example, Oscillators 203a and 203b may include a series of inverting circuits for creating a delay time that corresponds to the frequency. In one embodiment, a high value on the input clock signal may bypass a portion of the inverting circuits, thereby reducing the delay time and increasing the frequency. In another embodiment, a high value on the input clock signal may reduce a rise and fall time of the inverting circuits, thereby reducing the delay time. It is noted that, in other embodiments, a low value, rather than a high value, on the input clock signals may increase the frequencies of Oscillator Outputs 212.

In the illustrated embodiment, Oscillator Circuit 203 is designed such that the frequencies of Oscillator Outputs 212 are substantially the same when the duty cycles of the respective input clock signals are the same. It is noted that, due to imperfections and limitations of various IC fabrication technologies, the respective frequencies of Oscillator Outputs 212 may not be exactly the same in response to the same input clock signal. Any suitable calibration method may be employed to compensate or correct for relative differences between the frequencies of Oscillators 203a and 203b, thereby balancing the frequency responses of Oscillator Outputs 212.

Oscillator Outputs 212a and 212b are sent to Counter Circuit 204. Counter Circuit 204 includes Counters 204a and 204b. Each of Counters 204a and 204b increments a respective count value in response to an active transition of the respective Oscillator Output 212a and 212b. In various embodiments, an active transition may correspond to a rising transition, a falling transition or to either transition of Oscillator Outputs 212. In addition, in some embodiments, Counter Circuit 204 may decrement, instead of increment, the respective count value. Counter 204a increments Up Count Value 213, while Counter 204b increments Down Count Value 214. Both Counters 204a and 204b are reset to count values of zero upon an initiation of a duty cycle measurement. In other embodiments, however, other initial count values may be used, including different initial count values for each of Counters 204a and 204b. In some embodiments, the initial count values may be programmable. In such embodiments, initial values for each of Counters 204a and 204b may be determined, by a processor in the IC, based on a desired duty cycle.

In the illustrated embodiment, when the duty cycle of Clock Signal 210 is greater than 50%, then the duty cycle of Inverse Clock Signal 211 is less than 50% (the duty cycle of Inverse Clock Signal 211 is 100% minus the duty cycle of Clock Signal 210). This results in the frequency of Oscillator 203a being faster than the frequency of Oscillator 203b. As a result, Up Count Value 213 is greater than Down Count Value 214. Both Up Count Value 213 and Down Count Value 214 are sent to SUB 205. SUB 205 subtracts Down Count Value 214 from Up Count Value 213 to generate Count Delta 215. The value of Count Delta 215 may correspond to the duty cycle of Clock Signal 210. For example, assuming the frequency responses of Oscillator Circuits 203 are balanced, a 50% duty cycle may result in a value of zero for Count Delta 215, while a greater than 50% duty cycle may result in a positive value of Count Delta 215 and a less than 50% duty cycle may result in a negative value of Count Delta 215. In other embodiments, to avoid a negative value for Count Delta 215 and allow use of unsigned values, Counter 204a may be reset to a value greater than one, while Counter 204b is reset to zero. The initial value of Counter 204a may be selected such that a 20% duty cycle results in a value of Count Delta 215 that is near zero.

Count Delta 215 is sent to Duty Cycle Register 206. Duty Cycle Register 206, in the illustrated embodiment, includes logic to transform Count Delta 215 into Duty Cycle Value 216. Duty Cycle Value 216 corresponds to an indication of the duty cycle of Clock Signal 210 that may be utilized by Duty Cycle Adjustment Circuit 208. In some embodiments, no additional adjustments may be necessary, and the value of Count Delta 215 may be stored and used as Duty Cycle Value 216 without changes. In other embodiments, the value of Count Delta 215 may be scaled to a larger or smaller value, adjusted by a correction factor to compensate for differences between Oscillators 203a and 203b, or averaged with one or more previously generated values of Count Delta 215 to determine an average duty cycle over a longer period of time. The resulting Duty Cycle Value 216 may be stored within Duty Cycle Register 206 to be accessed by Duty Cycle Adjustment Circuit 208, or may be sent to Duty Cycle Adjustment Circuit 208 once the value is available.

Duty Cycle Adjustment Circuit 208, in the illustrated embodiment, receives Duty Cycle Value 216, and, using this value, may adjust circuits in Clock Generator Circuit 207 to modify a duty cycle of Clock Signal 210. Duty Cycle Adjustment Circuit 208 may, in some embodiments, correspond to Duty Cycle Adjustment Circuit 104 in FIG. 1, and, therefore, may use one or more algorithms as described above for determining a suitable adjustment value. In some embodiments, Duty Cycle Register 206, as well as Oscillator Circuit 203 and INV 202, may be coupled to more than one clock generation circuit through a multiplexing circuit, allowing more than one clock signal to be monitored.

It is noted that Monitoring Circuit 200 illustrated in FIG. 1 is merely an example. In other embodiments, a different number of circuit blocks and different configurations of circuit blocks may be possible, and may depend upon a specific application for which Monitoring Circuit 200 is intended. In some embodiments, Clock Generator Circuit 207 and Duty Cycle Adjustment Circuit 208 may not be included in Monitoring Circuit 200.

Figure 3:
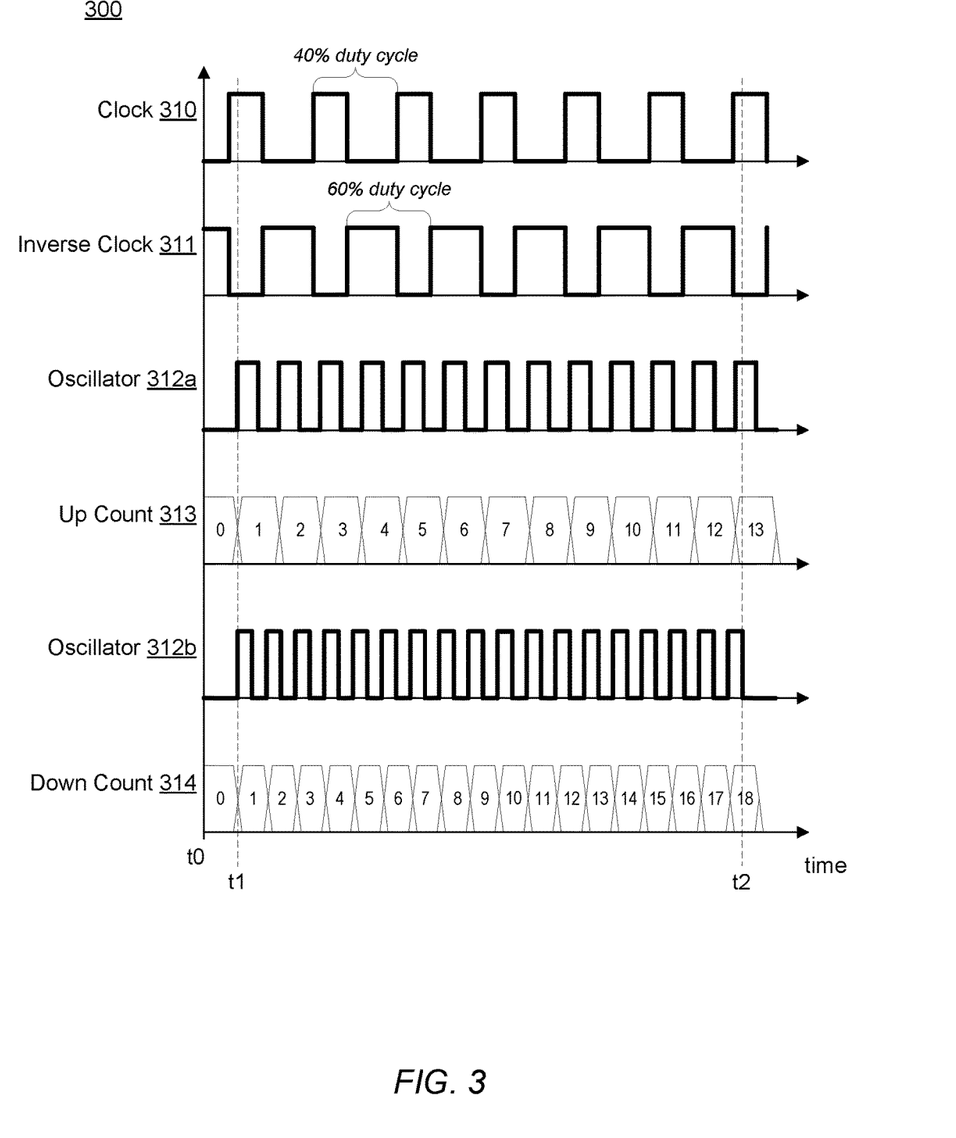
FIG. 3 shows a chart showing an example of signals associated with an embodiment of a duty cycle monitoring circuit, such as the circuit of FIG. 2.

Turning to FIG. 3, a chart showing an example of signals associated with an embodiment of a duty cycle monitoring circuit is illustrated. In the illustrated embodiment, Chart 300 includes six waveforms, each corresponding to a respective signal associated with Monitoring Circuit 200 of FIG. 2. Chart 300 illustrates a voltage level versus time for four of the waveforms, including Clock Signal 310, Inverse Clock Signal 311, Oscillator Signal 312a, and Oscillator Signal 312b. Waveforms Up Count Value 313 and Down Count Value 314 depict count values versus time, associated with Counters 204a and 204b. In the illustrated embodiment, the six waveforms of Chart 300 correspond to similarly named and numbered signals shown in FIG. 2.

In various embodiments, at time t0, Monitoring Circuit 200 may be disabled, between monitoring samples, or completing a previous sample of the duty cycle of Clock Signal 310. Oscillator Signals 312a and 312b may be inactive if Monitoring Circuit 200 is inactive. Values of Up Count Value 313 and Down Count Value 314 are reset to zero in the illustrated embodiment, although, other initial values may be used in other embodiments. At time t1, a new sample of the duty cycle of Clock Signal 310 may begin. A frequency of Oscillator Signal 312a is determined by the duty cycle of Clock Signal 310, while a frequency of Oscillator Signal 312b is determined by the duty cycle of Inverse Clock Signal 311. As shown in Chart 300, the duty cycle of Clock Signal 310 is 40%, resulting in a duty cycle of 60% for Inverse Clock Signal 311. Since the duty cycle of Inverse Clock Signal 311 is greater than the duty cycle of Clock Signal 310, the frequency of Oscillator Signal 312b is greater than the frequency of Oscillator Signal 312a.

During a sample time period, between times t1 and t2, Up Count Value 313 and Down Count Value 314 are incremented in response to respective rising transitions on Oscillator Signal 312a and Oscillator Signal 312b. Since the frequency of Oscillator Signal 312b is greater than the frequency of Oscillator Signal 312a, Down Count Value 314 increments faster than Up Count Value 313. The sample time period ends at time t2. Up Count Value 313 ends with a value of 13, while Down Count Value 314 ends with a value of 18. Referring to FIG. 2, both values are sent to SUB 205 where Down Count Value 314 (18) is subtracted from Up Count Value 313 (13), resulting in a value of Count Delta 215 being −5. The value −5 is sent to Duty Cycle Register 206, which, in some embodiments, may use the value of −5 to generate Duty Cycle Value 216. In other embodiments, Duty Cycle Value 216 may be set to a value of −5.

Oscillator Signals 312a and 312b may be disabled after time t2, or may continue to run for a next sample time period. Up Count Value 313 and Down Count Value 314 may be reset in preparation for a next sample time period. Clock Signal 310 may remain active, or in some embodiments, may be gated off at an input to Monitor Circuit 200 to conserve power.

It is noted that the embodiment of Chart 300 as illustrated in FIG. 3 is merely an example. The illustration of FIG. 3 has been simplified for clarity. In other embodiments, the waveforms may appear different due to different rise and fall times of logic circuits in various semiconductor manufacturing technologies, as well as noise and other conditions that may result in non-linear waveforms.

Figure 4:
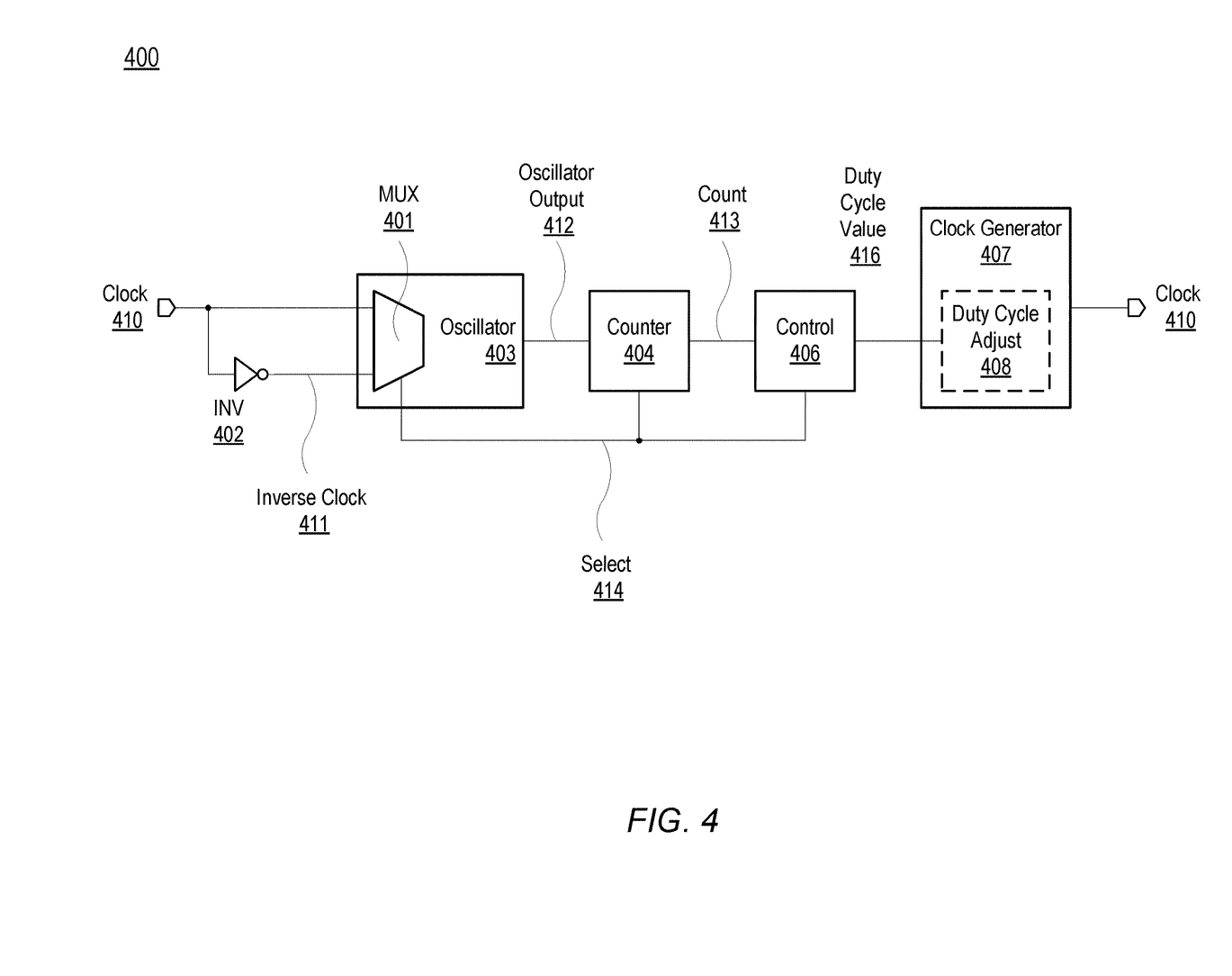
FIG. 4 depicts a block diagram of another embodiment of a duty cycle monitoring circuit.

Proceeding to FIG. 4, a block diagram of another embodiment of a duty cycle monitoring circuit, is depicted. Monitoring Circuit 400 may be included in an IC that includes a clock generation circuit, such as, for example, System 100 in FIG. 1. In the illustrated embodiment, Monitoring Circuit 400 sends Clock Signal 410 to inverting circuit (INV) 402, as well as to Oscillator Circuit 403. Oscillator Circuit 403 is coupled to Counter Circuit 404, which, in turn, is coupled to Control Circuit 406. Control Circuit 406 is coupled to Duty Cycle Adjustment Circuit 408 within Clock Generator Circuit 407. Clock Generator Circuit 407 generates Clock Signal 410 that is sent back to Oscillator Circuit 403 and INV 402.

Monitoring Circuit 400, similar to Monitoring Circuit 200 in FIG. 2, may be used to observe a duty cycle of Clock Signal 410. Clock Signal 410 is sent to Oscillator Circuit 403 and to INV 402. INV 402 inverts Clock Signal 410, generating Inverse Clock Signal 411, which is also sent to Oscillator Circuit 403. In the illustrated embodiment, Oscillator Circuit 403 includes multiplexing circuit (MUX) 401. MUX 401 receives Select Signal 414 from Control Circuit 406 and based on a state of Select Signal 414, passes either Clock Signal 410 or Inverse Clock Signal 411 to an oscillator in Oscillator Circuit 403. Oscillator Circuit 403 generates Oscillator Output Signal 412 with a frequency that is based on a duty cycle of the selected clock signal passed via MUX 401. Counter Circuit 404 either increments or decrements Count Value 413 in response to active transitions of Oscillator Output Signal 412. Select Signal 414 is received by Counter Circuit 404 and determines if Counter Circuit 404 increments or decrements in response to the active transitions. As disclosed above, an active transition of Oscillator Output Signal 412 may correspond to rising, falling, or either type of transition.

In one embodiment, Control Circuit 406 asserts a first value onto Select Signal 414, causing MUX 401 to pass Clock Signal 410 and causing Counter Circuit 404 to increment Count Value 413. Control Circuit 406 asserts this first value for a first time period. At the end of the first time period, Control Circuit 406 asserts a second value onto Select Signal 414, causing MUX 401 to pass Inverse Clock Signal 411 and causing Counter Circuit 404 to decrement Count Value 413. A sample time period may be equal to an occurrence of a first time period followed by a subsequent second time period. If the first time period and the second time period are of equal length, then if Clock Signal 410 has a 50% duty cycle, Count Value 413 will equal zero at the end of a sample time period. If Clock Signal 410 has a greater than 50% duty cycle, Count Value 413 will have a positive value, and vice versa if the duty cycle of Clock Signal 410 is less than 50%.

In some embodiments, a length of time for the first and second time periods may be programmable. In such embodiments, the lengths of time may be selected such that, when Clock Signal 410 has the desired duty cycle, Count Value 413 has a value at or near zero at the end of the sample time period. For example, if the first time period is set to a shorter length than the second time period, then, at the end of a sample period, Count Value 413 may equal zero when the duty cycle of Clock Signal 410 is greater than 50%. Oscillator Circuit 403, in this example, would run faster during the first time period in order to produce a same number of oscillations that are produced in the second, longer, time period. The length of the time periods may be determined by a processor, or software running on a processor, based on the desired duty cycle.

Count Value 413 is sent to Control Circuit 406, which may include memory, a register, or other data storage circuit to hold a value of Count Value 413. In some embodiments, more than one value of Count Value may be stored, allowing Control Circuit 406 to average or filter several recent values to determine Duty Cycle Value 416. In other embodiments, a scaling operation or other operation may be performed on Count Value 413 to determine Duty Cycle Value 416, or Duty Cycle Value 416 may be set equal to Count Value 413. Duty Cycle Value 416 may also be stored in Control Circuit 406.

Duty Cycle Adjustment Circuit 408 may receive Duty Cycle Value 416 or may read Duty Cycle Value 416 from Control Circuit 406. Duty Cycle Adjustment Circuit 408, in the illustrated embodiment, uses one or more values of Duty Cycle Value 416 to determine an adjustment value with which to adjust the duty cycle of Clock Signal 410. Duty Cycle Adjustment Circuit 408 may compare the value of Duty Cycle Value 416 to an expected value and, based on the comparison, determine a new adjustment value for Clock Generator Circuit 407. For example, if a 50% duty cycle is desired, then the expected value may correspond to zero. Values of Duty Cycle Value 416 above zero may correspond to a greater than 50% duty cycle for Clock Signal 410. As a result, Duty Cycle Adjustment Circuit 408 may determine an adjustment value that reduces the duty cycle of Clock Signal 410.

In some embodiments, to generate a duty cycle other than 50%, an expected value other than zero may be used. In other embodiments, the first and second time periods may be set to different lengths such that a Count Value 413 of zero results in the desired duty cycle.

Clock Generator Circuit 407 and/or Duty Cycle Adjustment Circuit 408, in some embodiments, may be omitted and Duty Cycle Value 416 may be used in a test procedure as a pass/fail assessment of Clock Signal 410. In a further embodiment, Duty Cycle Value 416 may be sent to a circuit that utilizes Clock Signal 410. In such an embodiment, the circuit may use Duty Cycle Value 416 to make internal adjustments to compensate for a duty cycle that deviates from the desired value.

It is noted that the embodiment of FIG. 4 merely illustrates an example of a duty cycle monitoring circuit. The circuit blocks shown in FIG. 4 may vary in other embodiments. Clock Signal 410 may correspond to any suitable clock signal in the IC, and may, in some embodiments, correspond to different clock signals at different times dependent on current settings in the IC.

Figure 5:
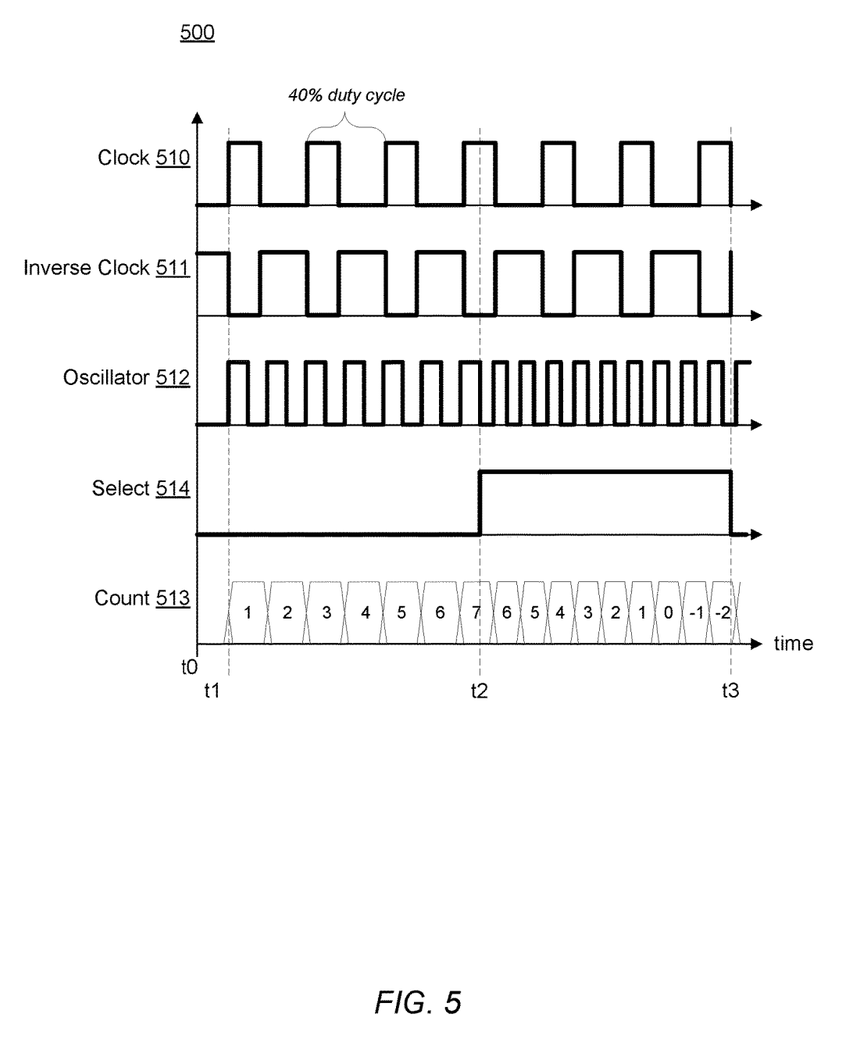
FIG. 5 illustrates a chart showing an example of signals associated with another embodiment of a duty cycle monitoring circuit, such as the circuit of FIG. 4.

Moving now to FIG. 5 shows a chart including possible waveforms associated with an embodiment of Monitoring Circuit 400 presented in FIG. 4. The waveforms of chart 500 illustrate voltage or logic levels versus time for four signals shown in FIG. 4. Referring collectively to FIG. 4 and FIG. 5, chart 500 includes waveforms Clock Signal 510, Inverse Clock Signal 511, Oscillator Output Signal 512, and Select Signal 514. Chart 500 also includes a waveform indicating a value of Count Value 513 over time. In the illustrated embodiment, the waveforms of Chart 500 correspond to the similarly named and numbered signals of FIG. 4.

At time t0, Monitoring Circuit 400 may be disabled, between monitoring samples, or completing a previous sample of the duty cycle of Clock Signal 510, in various embodiments. If Monitoring Circuit 400 is inactive at time t0, then Oscillator Output Signal 512 may also be inactive. A value of Count Value 513 is reset to zero in the illustrated embodiment, although, other initial values may be used in other embodiments. At time t1, a new sample of the duty cycle of Clock Signal 510 may begin by initiating a first time period. Select Signal 514 is asserted to a logic low level by Control Circuit 406, causing MUX 401 to select Clock Signal 510 as the input to Oscillator Circuit 403. A frequency of Oscillator Output Signal 512 is determined by the duty cycle of Clock Signal 510 between times t1 and t2. As shown in Chart 500, the duty cycle of Clock Signal 510 is 40%. During the first time period from time t1 to time t2, Count Value 513 is incremented, reaching a value of 7 by time t2.

At time t2, the first time period ends and a second time period begins. In the illustrated embodiment, Control Circuit 406 asserts a logic high value on Select Signal 514, causing the frequency of Oscillator Output Signal 512 to be determined by the duty cycle of Inverse Clock Signal 511. During the second time period from time t2 to time t3, Count Value 513 is decremented. Since the duty cycle of Clock Signal 510 is 40%, duty cycle of Inverse Clock Signal 511 is 60%. Since the duty cycle of Inverse Clock Signal 511 is greater than the duty cycle of Clock Signal 510, the frequency of Oscillator Output Signal 512 is greater in the second time period than in the first time period. When the second time period ends at time t3, Count Value 513 has reached a value of −2. At time t3, Count Value 513 may be sent to Control Circuit 406, which may also assert Select Signal 514 to a logic low value and reset Count Value 513 to an initial value.

It is noted that chart 500 of FIG. 5 merely illustrates an example of signals resulting from one embodiment of Monitoring Circuit 400. Chart 500 illustrates the signals as having certain polarities and active edges. Other signal polarities and active edges are contemplated. For example, Count Value 513 is illustrated as incrementing in the first time period and decrementing in the second. In other embodiments, the opposite may occur. The signals are simplified to provide clear descriptions of the disclosed concepts. In various embodiments, the signals may appear different due various influences such as technology choices for building the circuits, actual circuit design and layout, ambient noise in the environment, choice of power supplies, etc.

Figure 6:
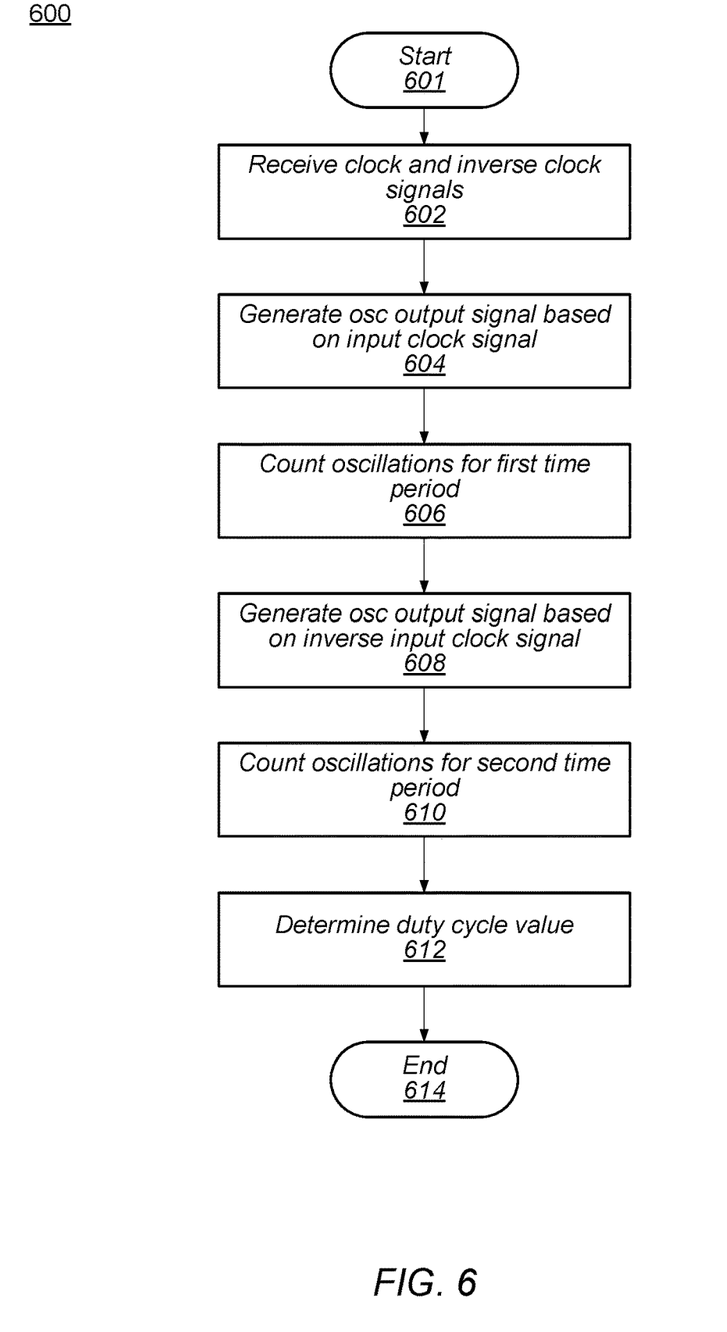
FIG. 6 shows a flow diagram illustrating an embodiment of a method for operating a duty cycle monitoring circuit.

Turning now to FIG. 6, a flow diagram of an embodiment of a method for operating a duty cycle monitoring circuit is shown. The method may be applied to any suitable duty cycle monitoring circuit, such as, for example, Monitoring Circuit 200 in FIG. 2 or Monitoring Circuit 400 in FIG. 4. Referring collectively to Monitoring Circuit 200, Monitoring Circuit 400 and method 600 in FIG. 6, the method may begin in block 601.

A clock signal and an inverse of the clock signal are received (block 602). Using Monitoring Circuit 400 as an example, Oscillator Circuit 403 receives Clock Signal 410 and Inverse Clock Signal 411. In the embodiment of FIG. 4, Clock Signal 410 is received from Clock Generator Circuit 407. In other embodiments, however, Clock Signal 410 may be received from other signal generating circuits. In some embodiments, Clock Signal 410 may be selected from multiple signal sources as Monitoring Circuit 400 may be used to monitor more than one clock signal.

An oscillator output signal is generated based a duty cycle of the clock signal (block 604). In one embodiment, Control Circuit 406 asserts a first value on Select Signal 414, causing MUX 401 to select Clock Signal 410 as an input to an oscillator within Oscillator Circuit 403. Oscillator Circuit 403 generates Oscillator Output Signal 412 with a frequency based on a duty cycle of Clock Signal 410. In other embodiments, such as, for example, Monitoring Circuit 200, Oscillator Circuit 203 includes Oscillator 203a that receives Clock Signal 210 and generates Oscillator Output 212a with a frequency based on a duty cycle of Clock Signal 210.

A counter circuit counts oscillations of the oscillator output signal for a first period of time (block 606). Counter Circuit 404 receives Oscillator Output Signal 412 and, in one embodiment, increments Count Value 413 in response to each active transition of Oscillator Output Signal 412. As previously disclosed, an active transition may correspond to a rising, falling, or either transition on Oscillator Output Signal 412 in various embodiments. In an embodiment of Monitoring Circuit 200, Counter 204a increments Up Count Value 213 in response to an active transition on Oscillator Output 212a.

An oscillator output signal is generated based a duty cycle of the inverse clock signal (block 608). In the embodiment of Monitoring Circuit 400, Control Circuit 406 asserts Select Signal 414 to a second value at the end of the first time period, beginning a second time period. The second value causes MUX 401 to select Inverse Clock Signal 411 as an input to Oscillator Circuit 403. Oscillator Output Signal 412 is generated with a frequency based a duty cycle of Inverse Clock Signal 411. In the embodiment of Monitoring Circuit 200, Inverse Clock Signal 211 is received by Oscillator 203b in Oscillator Circuit 203 in parallel with Oscillator 203a receiving Clock Signal 210. Oscillator 203b generates a clock signal, Oscillator Output 212b, with a frequency based on a duty cycle of Inverse Clock Signal 211 while Oscillator 203a generates Oscillator Output 212a.

The counter circuit counts oscillations of the oscillator output signal for a second period of time (block 610). Counter Circuit 404 continues to receive Oscillator Output Signal 412 in the embodiment of Monitoring Circuit 400. The second value of Select Signal 414 causes Counter Circuit 404 to decrement Count Value 413 in response to subsequent active transitions on Oscillator Output Signal 412. In the embodiment of Monitoring Circuit 200, Oscillator Output 212b is received by Counter 204b in Counter Circuit 204. In response to active transitions on Oscillator Output 212b, Counter 204b increments Down Count Value 214, while Counter 204a increments Up Count Value 213 in response to transitions on Oscillator Output 212a.

A value for the duty cycle of the clock signal is determined (block 612). In the embodiment of Monitoring Circuit 400, Control Circuit 406 receives Count Value 413 from Counter Circuit 404. Based on the value of Count Value 413 at the end of the second time period, Control Circuit 406 determines a value indicative of the duty cycle of Clock Signal 410. In some embodiments, Control Circuit 406 sets Duty Cycle Value 416 equal to Count Value 413. In other embodiments, Control Circuit 406 may perform one or more operations on Count Value 413 to determine a value for Duty Cycle Value 416. The method ends in block 614.

In the embodiment of Monitoring Circuit 200, Up Count Value 213 and Down Count Value 214 are sent to SUB 205 at the end of a sample time period. SUB 205 subtracts Down Count Value 214 from Up Count Value 213 to generate Count Delta 215. Duty Cycle Register 206 receives Count Delta 215 and sets a value of Duty Cycle Value 216 based on Count Delta 215. In various embodiments, Duty Cycle Value 216 may be set equal to Count Delta 215 or one or more operations may be performed on Count Delta 215 to determine Duty Cycle Value 216. The method ends in block 614.

In some embodiments, the duty cycle value may be stored in the duty cycle monitoring circuit and/or sent to another circuit, such as, for example, Duty Cycle Adjustment Circuits 208 and 408. A duty cycle adjustment circuit may use the duty cycle value to adjust a duty cycle of a clock generator circuit as part of a process to attain a desired duty cycle in a clock signal. In other embodiments, the duty cycle value may be generated as part of a test or evaluation process to determine a functionality or performance level of a clock generator circuit. Details of such an embodiment are presented below.

It is noted that the method illustrated in FIG. 6 is merely an example. In other embodiments, variations of this method are contemplated. Some operations may be performed in a different sequence, and/or additional operations may be included. In some embodiments, some operations may occur in parallel, such as, for example, blocks 604 and 606 may be performed in parallel with blocks 608 and 610 in an embodiment such as FIG. 2.

Figure 7:
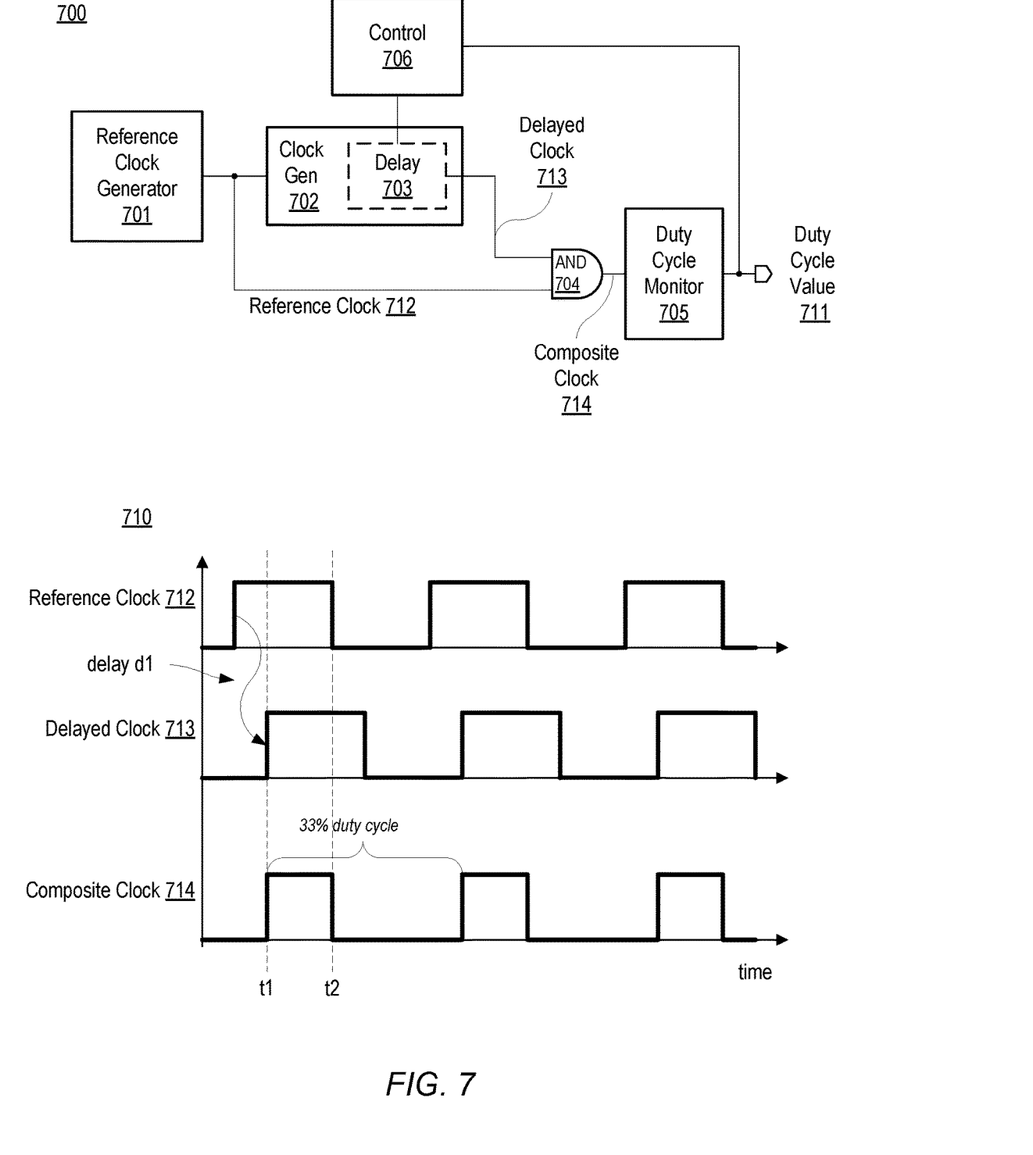
FIG. 7 depicts an embodiment of a clock testing system including a chart illustrating examples of associated waveforms.

Proceeding now to FIG. 7 an embodiment of a clock testing system including a chart illustrating examples of associated waveforms is depicted. In the illustrated embodiment, System 700 shows an example of a clock testing system utilizing a duty cycle monitoring circuit such as, for example, Monitoring Circuit 200 or 400 in FIGS. 2 and 4, respectively. System 700 includes Reference Clock Generator 701 coupled to Clock Generation Circuit 702, which, in turn, is coupled to logic gate AND 704. AND 704 is coupled to Duty Cycle Monitor 705. Clock Generation Circuit (Clock Gen) 702 includes Delay Circuit 703. Duty Cycle Monitor 705 generates Duty Cycle Value 711. FIG. 7 also includes Chart 710 which depicts waveforms of voltage versus time for several signals associated with System 700: Reference Clock Signal 712, Delayed Clock Signal 713, and Composite Clock Signal 714.

System 700 illustrates an embodiment for testing Clock Generation Circuit 702, and more specifically, for testing an accuracy of Delay Circuit 703. Clock Generation Circuit 702 may correspond to, e.g., a DLL circuit, and, therefore, may utilize Delay Circuit 703 to generate a clock signal with a particular frequency. In various embodiments, Delay Circuit 703 may be designed to provide a fixed delay time or be programmable to provide a range of delay times. In either case, Delay Circuit 703 may also include a calibration circuit that allows a given delay time to be adjusted to an expected amount of time. System 700 utilizes Duty Cycle Monitor 705, which may correspond to an embodiment of Monitor Circuit 200 in FIG. 2 or Monitor Circuit 400 in FIG. 4. To test the accuracy of Delay Circuit 703, Reference Clock Generator 701 generates Reference Clock Signal 712 with a known duty cycle, for example, 50%, as shown in Chart 710. Clock Generation Circuit 702 receives Reference Clock Signal 712 and generates Delayed Clock Signal 713, using Delay Circuit 703. Delayed Clock Signal 713 has a same duty cycle and frequency as Reference Clock Signal 712, but is delayed by an amount of time determined by Delay Circuit 703, as shown in Chart 710. AND 704 receives both Reference Clock Signal 712 and Delayed Clock Signal 713 and generates Composite Clock Signal 714 by logically "AND'ing" the received signals.

As shown in Chart 710, Composite Clock Signal 714 transitions to a logic high level at time t1, when both Reference Clock Signal 712 and Delayed Clock Signal 713 are also at logic high levels. Composite Clock Signal 714 transitions to a logic low level at time t2, in response to Reference Clock Signal 712 transitioning to a logic low level. Delay time d1, as determined by Delay Circuit 703, determines a duty cycle of Composite Clock Signal 714. In the embodiment of Chart 710, Delay time d1 is equal to one-third of the high pulse of Reference Clock Signal 712, resulting in a high pulse on Composite Clock Signal 714 being two thirds of the high pulse of Reference Clock Signal 712. Since the duty cycle of Reference Clock Signal 712 is 50%, the duty cycle of Composite Clock Signal 714 is two-thirds of 50%, or 33.3%.

In the illustrated embodiment, Duty Cycle Monitor 705 uses a method, such as Method 600 in FIG. 6, to determine a value for Duty Cycle Value 711, including receiving Composite Clock Signal 714 and generating an inverse of Composite Clock Signal 714. After performing the method, Duty Cycle Monitor 705 may generate a value for Duty Cycle Value 711 that corresponds to the 33.3% duty cycle of Composite Clock Signal 714. Control Circuit 706 receives Duty Cycle Value 711 and may compare this value with an expected duty cycle value corresponding to the expected delay time d1. If the expected duty cycle does not match Duty Cycle Value 711, Control Circuit 706 may, in various embodiments, attempt to calibrate Delay Circuit 703 or may generate an indication that Delay Circuit 703 has failed the test.

It is noted that FIG. 7 is merely an example of a clock testing system. Other methods of testing a clock generation circuit may include additional circuit blocks. Furthermore, the waveforms of Chart 710 may differ from the waveforms shown. The illustrated signals are simplified for demonstrative purposes. In other embodiments, the waveforms may differ due various conditions and parameters, such as, e.g., technology choices for building the circuits, actual circuit design and layout, ambient noise in the environment, choice of power supplies, and the like.

Figure 8:
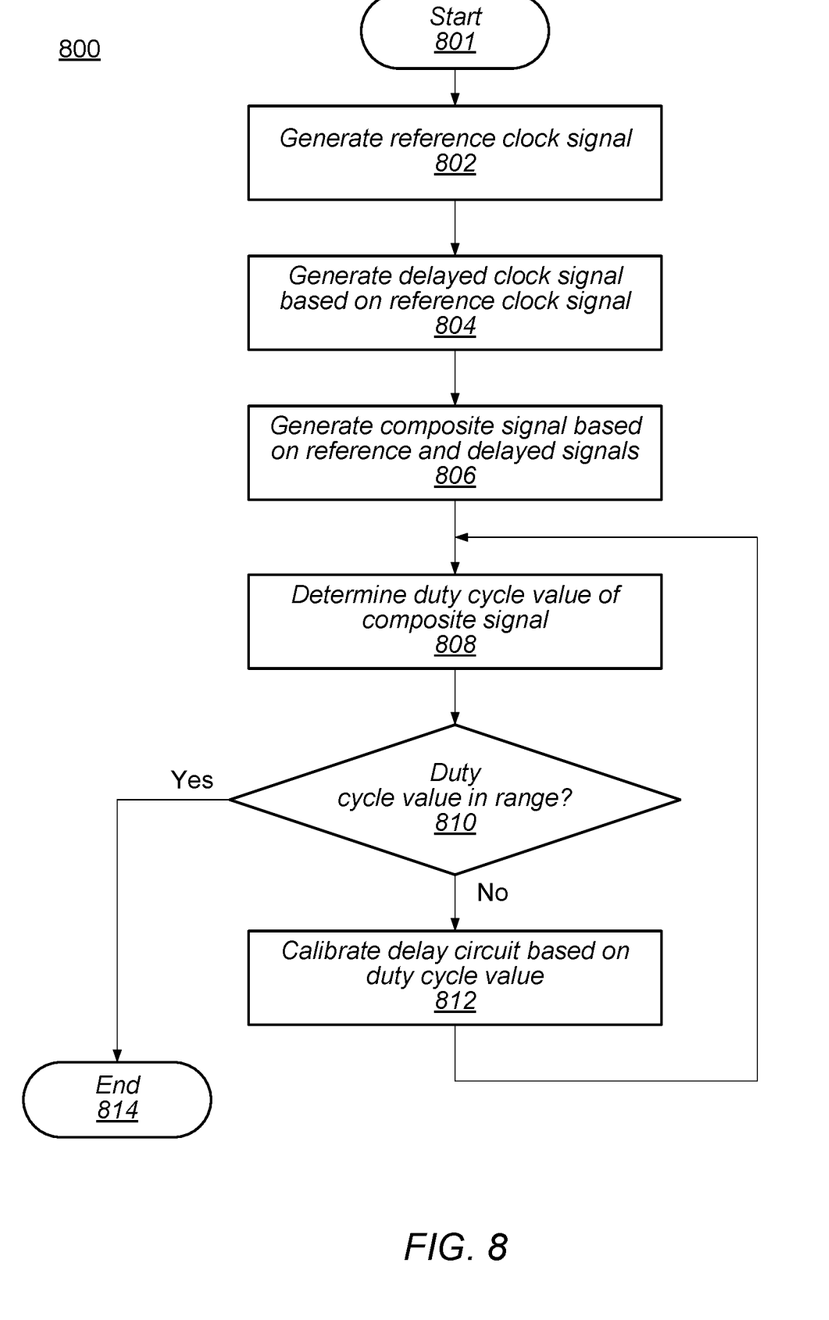
FIG. 8 illustrates a flow diagram illustrating an embodiment of a method for testing a clock generation circuit.

Moving to FIG. 8, a flow diagram of an embodiment of a method for testing a clock generation circuit is illustrated. The method may be applied to a clock testing system, such as, for example, System 700 in FIG. 7. Referring collectively to FIG. 7 and method 800 in FIG. 8, the method may begin in block 801.

A reference clock signal is generated (block 802). Reference Clock Generator 701 generates Reference Clock Signal 712. A duty cycle of Reference Clock Signal 712 may be known from a previous monitoring operation. Clock Generation Circuit may correspond to any suitable type of clock generation circuit.

A delayed clock signal is generated based on the reference clock signal (block 804). In the illustrated embodiment, Clock Generation Circuit 702 receives Reference Clock Signal 712 and generates Delayed Clock Signal 713 using Delay Circuit 703. A value for a delay time of Delay Circuit 703 may be set by Control Circuit 706 based on an expected delay time. Delayed Clock Signal 713 is generated with a same frequency and duty cycle as Reference Clock Signal 712, but with transitions delayed for the delay time set by Control Circuit 706.

A composite clock signal is generated based on the reference and delay clock signals (block 806). AND 704, in the illustrated embodiment receives Reference Clock Signal 712 and Delayed Clock Signal 713 and generates Composite Clock Signal 714 by asserting Composite Clock Signal 714 to a high value when both received clock signals have logic high values. The frequency of Composite Clock Signal 714 is the same as the frequency of Reference Clock Signal 712 and Delayed Clock Signal 713. The duty cycle, however, may differ from the duty cycle of the received clock signals based on the delay time of Delay Circuit 703.

A duty cycle of the composite clock signal is determined (block 808). In the illustrated embodiment, Duty Cycle Monitor 705, using a method such as, e.g., Method 600 of FIG. 6, determines a value for Duty Cycle Value 711, indicative of the duty cycle of Composite Clock Signal 714. In some embodiments, Duty Cycle Value 711 may be sent to Control Circuit 706. In other embodiments, Duty Cycle Value 711 may be stored in Duty Cycle Monitor 705 and read by Control Circuit 706.

Further operations of Method 800 may depend on the determined duty cycle value (block 810). Control Circuit 706, in the illustrated embodiment, compares Duty Cycle Value 711 to an expected value based on the expected delay time of Delay Circuit 703. If Duty Cycle Value 711 deviates by more than an acceptable limit from the expected value, then the method moves to block 812 to calibrate Delay Circuit 703. Otherwise, the method ends in block 814.

The delay circuit is calibrated based on the determined duty cycle value (block 812). Based on a difference between Duty Cycle Value 711 and the expected value, Control Circuit 706 determines an adjustment for calibrating Delay Circuit 703. Delay Circuit 703 may correspond to any suitable delay circuit. In one embodiment, Delay Circuit 703 may include a resistor-capacitor (RC) circuit that is calibrated by adjusting the amount of resistance, the amount of capacitance, or both. In another embodiment, Delay Circuit 703 may include one or more logic gates. Such a delay circuit may be calibrated by adjusting a rise and or fall time for signal transitions passing through the logic gate. Once Delay Circuit 703 has been calibrated by Control Circuit 706, the method may return to block 808 to determine a new value for Duty Cycle Value 711.

It is noted that the method illustrated in FIG. 8 is merely an example. In other embodiments, variations of this method are contemplated. Some operations may be performed in a different sequence, and/or additional operations may be included. In some embodiments, some operations may occur in parallel.

Figure 9:
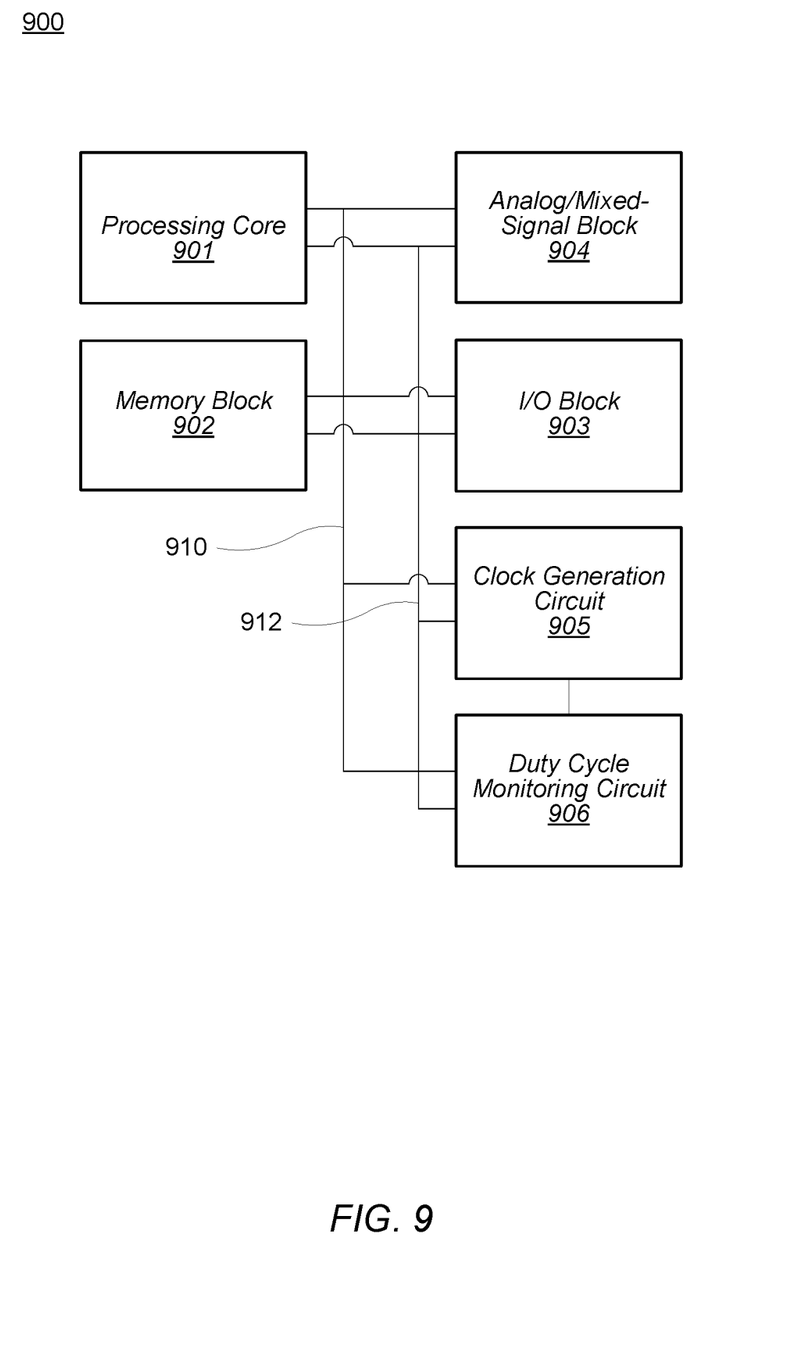
FIG. 9 shows a block diagram of an embodiment of an integrated circuit (IC).

Turning to FIG. 9, a block diagram of an embodiment of an integrated circuit (IC) is illustrated. IC 900 may represent an embodiment of an IC that includes a duty cycle monitoring circuit, such as described herein. In the illustrated embodiment, IC 900 includes Processing Core 901 coupled to Memory Block 902, I/O Block 903, Analog/Mixed-Signal Block 904, Clock Generation Circuit 905, all coupled through bus 910. Additionally, Clock Generation Circuit 905 provides a clock output signal 912 to the circuit blocks in IC 900. In various embodiments, IC 900 may correspond to a system on a chip (SoC) for use in a mobile computing application such as, e.g., a tablet computer, smartphone or wearable device.

Processing Core 901 may, in various embodiments, be representative of a general-purpose processor that performs computational operations. For example, Processing Core 901 may be a central processing unit (CPU) such as a microprocessor, a microcontroller, an application-specific integrated circuit (ASIC), or a field-programmable gate array (FPGA). In some embodiments, Processing Core 901 may include multiple CPU cores and may include one or more register files and memories. In various embodiments, Processing Core 901 may implement any suitable instruction set architecture (ISA), such as, e.g., PowerPC™, or x86 ISAs, or combination thereof. Processing Core 901 may include one or more bus transceiver units that allow Processing Core 901 to communicate to other functional circuits via bus 910, such as, Memory Block 902, for example.

Memory Block 902 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as Memory Block 902 and other embodiments may include more than two memory blocks (not shown). In some embodiments, Memory Block 902 may be configured to store program instructions that may be executed by Processing Core 901. Memory Block 902 may be configured to store data to be processed, such as graphics data, for example. Memory Block 902, may, in some embodiments, include a memory controller for interfacing to memory external to IC 900, such as, for example, one or more DRAM chips.

I/O Block 903 is, in one embodiment, configured to coordinate data transfer between IC 900 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O Block 903 may include general-purpose input/output pins (I/O pins). In some embodiments, I/O Block 903 may be configured to implement a version of Universal Serial Bus (USB) protocol, IEEE 1394 (Firewire®) protocol, or an Ethernet (IEEE 802.3) networking standard.

In the illustrated embodiment, Analog/Mixed-Signal Block 904 includes one or more analog circuits. For example, Analog/Mixed-Signal Block 904 may include a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in Analog/Mixed Signal Block 904. In some embodiments, Analog/Mixed-Signal Block 904 may include radio frequency (RF) circuits that may be configured for operation with cellular telephone networks, or other suitable RF-based networks. Analog/Mixed-Signal Block 904 may include one or more voltage regulators to supply one or more voltages to various functional circuits and circuits within those blocks.

Clock Generation Circuit 905 may be configured to initialize and manage outputs of one or more clock sources. In various embodiments, the clock sources may be located in Analog/Mixed-Signal Block 904, in Clock Generation Circuit 905, in other blocks with IC 900, or come from external to IC 900, coupled through one or more I/O pins. In some embodiments, Clock Generation Circuit 905 may configure a selected clock source before it is distributed throughout IC 900. Clock Generation Circuit 905 may include one or more clock sources. In some embodiments, Clock Generation Circuit 905 may include one or more of PLLs, FLLs, DLLs, internal oscillators, oscillator circuits for external crystals, etc. One or more clock output signals 912 may provide clock signals to various circuits of IC 900.

Duty Cycle Monitoring Circuit 906 may correspond to Monitoring Circuit 200 in FIG. 2 or Monitoring Circuit 400 in FIG. 4. Duty Cycle Monitoring Circuit 906 may be used to monitor a duty cycle of one or more clock signals generated by Clock Generation Circuit 905, including clock output signals 912. In some embodiments, Duty Cycle Monitoring Circuit 906 may include a duty cycle adjustment circuit, such as, e.g. Duty Cycle Adjustment Circuit 104 in FIG. 1, to adjust a duty cycle of one or more clock signal generators in Clock Generation Circuit 905. In other embodiments, Duty Cycle Monitoring Circuit 906 may be used as part of a test procedure for IC 900, such as described above in regards to FIGS. 7 and 8.

It is noted that the IC illustrated in FIG. 9 is merely an example. In other embodiments, a different number of circuit blocks and different configurations of circuit blocks may be possible, and may depend upon a specific application for which the IC is intended.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 an oscillator circuit configured to:
  receive an input clock signal and an inverse input clock signal; and
  for a first time period, generate an oscillator output signal with a frequency based on a duty cycle of the input clock signal; and
  for a second time period, generate the oscillator output signal with a frequency based on a duty cycle of the inverse input clock signal;
 a counter circuit configured to count oscillations of the oscillator output signal over the first time period and over the second time period; and
 a control circuit configured to determine, based on the oscillations counted by the counter circuit during the first time period and the second time period, a duty cycle value indicative of the duty cycle of the input clock signal.

2. The apparatus of claim 1, further comprising a duty cycle adjustment circuit configured to compare the duty cycle value to an expected value.

3. The apparatus of claim 2, wherein the duty cycle adjustment circuit is further configured to modify a duty cycle of the input clock signal based on the comparison.

4. The apparatus of claim 2, further comprising a processor configured to determine and set the expected value based on a desired duty cycle for the input clock signal.

5. The apparatus of claim 1, wherein the counter circuit is further configured to:
increment a count value during the first time period; and
decrement the count value during the second time period, wherein the second time period is subsequent to the first time period.

6. The apparatus of claim 1, wherein a length of the first time period and a length of the second time period are programmable.

7. The apparatus of claim 1, wherein the control circuit is further configured to receive a first value corresponding to a length of the first time period and a second value corresponding to a length of the second time period, and wherein the first and second values are selected based on a desired duty cycle for the input clock signal.

8. An apparatus, comprising:
an oscillator circuit configured to:
receive an input clock signal and an inverse input clock signal;
generate a first oscillator output signal with a frequency based on a duty cycle of the input clock signal; and
generate a second oscillator output signal with a frequency based on a duty cycle of the inverse input clock signal;
a counter circuit configured to:
count oscillations of the first oscillator output signal for a specified time period; and
count oscillations of the second oscillator output signal for the specified time period; and
a control circuit configured to determine, based on the oscillations counted by the counter circuit for the specified time period, a duty cycle value indicative of the duty cycle of the input clock signal.

9. The apparatus of claim 8, further comprising a duty cycle adjustment circuit configured to compare the duty cycle value to an expected value.

10. The apparatus of claim 9, wherein the duty cycle adjustment circuit is further configured to modify a duty cycle of the input clock signal based on the comparison.

11. The apparatus of claim 9, further comprising a processor configured to determine and set the expected value based on a desired duty cycle for the input clock signal.

12. The apparatus of claim 8, wherein to count oscillations of the first oscillator output signal and the second oscillator output signal, the counter circuit is further configured to increment a first count value and a second count value during the specified time period.

13. The apparatus of claim 12, wherein to determine, based on the oscillations counted by the counter circuit during the specified time period, the duty cycle value, the control circuit is further configured to subtract the second count value from the first count value.

14. The apparatus of claim 12, wherein initial count values for the first count value and the second count value are programmable.

15. A system, comprising:
a reference clock generator configured to generate a reference clock signal;
a clock generation circuit, including a delay circuit, configured to generate a delayed clock signal based on the reference clock signal, wherein an amount of delay from the reference clock signal to the delayed clock signal is based on the delay circuit;
a logic circuit configured to generate a composite signal based on the reference clock signal and the delayed clock signal; and
a duty cycle monitor circuit configured to:
receive the composite signal;
generate an inverse composite signal;
generate an oscillator output signal, wherein a frequency of the oscillator output signal is based on a duty cycle of a selected one of the composite signal or the inverse composite signal;
count oscillations of the oscillator output signal for a first specified time period with the composite signal selected;
count oscillations of the oscillator output signal for a second specified time period with the inverse composite signal selected; and
determine, based on the oscillations counted during the first specified time period and the second specified time period, a duty cycle value indicative of the duty cycle of the composite signal.

16. The system of claim 15, further including a control circuit configured to calibrate the delay circuit based on the duty cycle value.

17. The system of claim 15, wherein to count oscillations of the oscillator output signal for the first specified time period, the duty cycle monitor circuit is further configured to increment a count value during the first specified time period.

18. The system of claim 17, wherein to count oscillations of the oscillator output signal for the second specified time period, the duty cycle monitor circuit is further configured to decrement the count value during the second specified time period, wherein the second specified time period is subsequent to the first specified time period.

19. The system of claim 18, wherein a length of the first specified time period and a length of the second specified time period are programmable and are determined based on a desired duty cycle for the composite signal.

20. The system of claim 15, wherein the duty cycle of the composite signal is indicative of the amount of delay of the delay circuit.

* * * * *